United States Patent
Siddiqui et al.

(10) Patent No.: US 9,618,929 B2
(45) Date of Patent: Apr. 11, 2017

(54) METHOD AND PRIORITY SYSTEM FOR INVENTORY MANAGEMENT IN SEMICONDUCTOR MANUFACTURING

(71) Applicant: WaferTech, LLC, Camas, WA (US)

(72) Inventors: Masreth Siddiqui, Vancouver, WA (US); Philip Yu, Vancouver, WA (US); Maria Gonchoroff, Camas, WA (US); Robert Hood, Vancouver, WA (US); Andy Brogan, Vancouver, WA (US); Philip Hunter, Vancouver, WA (US)

(73) Assignee: WAFERTECH, LLC, Camas, WA (US)

( * ) Notice: Subject to any disclaimer, the term of this patent is extended or adjusted under 35 U.S.C. 154(b) by 117 days.

(21) Appl. No.: 14/555,345

(22) Filed: Nov. 26, 2014

(65) Prior Publication Data
US 2016/0147219 A1 May 26, 2016

(51) Int. Cl.
| | |
|---|---|
| *G06F 19/00* | (2011.01) |
| *G05B 19/418* | (2006.01) |
| *G05B 19/00* | (2006.01) |
| *H01L 21/67* | (2006.01) |

(52) U.S. Cl.
CPC ........ *G05B 19/41865* (2013.01); *G05B 19/00* (2013.01); *G05B 2219/45031* (2013.01); *H01L 21/67276* (2013.01)

(58) Field of Classification Search
None
See application file for complete search history.

(56) References Cited

U.S. PATENT DOCUMENTS

| | | | | |
|---|---|---|---|---|
| 5,751,580 A | * | 5/1998 | Chi | G05B 19/41865 700/100 |
| 7,610,111 B2 | * | 10/2009 | Lin | G05B 19/41865 700/100 |
| 2003/0130756 A1 | * | 7/2003 | Baweja | G05B 19/41865 700/100 |
| 2006/0223334 A1 | * | 10/2006 | Saki | G05B 19/41865 438/765 |
| 2008/0020324 A1 | * | 1/2008 | Shiu | G03F 7/11 430/311 |
| 2008/0133041 A1 | * | 6/2008 | Schmidt | G05B 19/41865 700/101 |

\* cited by examiner

*Primary Examiner* — Ronald Hartman, Jr.
(74) *Attorney, Agent, or Firm* — Duane Morris LLP

(57) ABSTRACT

An inventory tracking system and method for use in semiconductor manufacturing provide for generating a priority score that determines the order in which lots of substrates should be run. The priority score is generated using an algorithm that takes into account external lot priority considerations, inventory factors in the manufacturing facility, and processing tool capability factors. The processing tool capability factors include factors related to tool status and tool restrictions and the inventory factors include factors related to line balance, WIP (work-in-progress) forecasts and various downstream considerations. The priority score is generated dynamically and displayed at each processing operation for each lot that is queued for processing at the indicated operation. Various algorithms are used and different weights are assigned to many factors in calculating numerical values for several factors that combine to produce the priority score. The generated priority score can be tool-specific or module-specific.

19 Claims, 4 Drawing Sheets

Dispatching Detail Score Lot: A   Lot Score Summary   Tool Active Rules

Lot Status:

| LotID | Prty | Prod Id | Route ID | Recipe | Stage | Stat | QTY | WTIME | Tool ID | KER Tool Group | Area |
|---|---|---|---|---|---|---|---|---|---|---|---|
| A | N | | | | | | | | X | ABC | ETCH |

Lot DPScore: ⎯367

| LotID | External Priority Score | Total Points From Dispatching Rules | Fix Point From Dispatching Rules | Interim DPScore |
|---|---|---|---|---|
| A | 816 | 300 | | 516 |

⎯313  ⎯303

Active Rules Applied to Lot:

| Id | Module | Rule Description | Parameter | Points | Weight | Total Points |
|---|---|---|---|---|---|---|
| 16 | Line Balance | Block Lot TR | | 300 | 1 | 300 |
| Total: | | | | | | |

⎯307  ⎯303

Tool Specific DPScore: ⎯311   ⎯305  ⎯309

| Lot Id | Tool | External Priority Score | Interim DPS | Score From Tool Rules | Adjusted Final DPS |
|---|---|---|---|---|---|
| A | X | 816 | 516 | 200 | 316 |
| | W | 816 | 516 | 100 | 416 |

FIG. 3

Dispatching Detail Score — 401

Lot Status:

| LotID | Prty | Prod Id | Route ID | Recipe | Stage | Stat | QTY | WTIME | Tool ID | KER Tool Group | Area |
|---|---|---|---|---|---|---|---|---|---|---|---|
| A | N | | | | | | | | X | ABC | IMP |

Lot DPScore: — 307

| LotID | External Priority Score | Total Points From Dispatching Rules | Fix Point From Dispatching Rules | Interim DPScore | Batch |
|---|---|---|---|---|---|
| A | 830 | | 250 | 580 | N |

— 313 — 303

Active Rules Applied to Lot:

| Id | Module | Rule Description | Parameter | Points | Weight | Total Points | Batch |
|---|---|---|---|---|---|---|---|
| 35 | Tool Description | Tool Wait Time | ALL WTime | 3.4 | 15 | 50.9 | N |
| 41 | Line Balance | X-Ratio by QTime | X-Ratio QTime | 200 | 1 | 200 | N |
| Total | | | | | | 250 | |

— 311  — 303

Tool Specific DPScore: — 307 — 305 — 309

| Lot Id | Tool | External Priority Score | Interim DPS | Score From Tool Rules | Adjusted Final DPS |
|---|---|---|---|---|---|
| A | X | 830 | 580 | 300 | 280 |
| | Y | 830 | 580 | 300 | 280 |
| | Z | 830 | 580 | 300 | 280 |
| | W | 830 | 580 | 300 | 280 |

FIG. 4

METHOD AND PRIORITY SYSTEM FOR INVENTORY MANAGEMENT IN SEMICONDUCTOR MANUFACTURING

BACKGROUND

In today's semiconductor manufacturing industry, it is important to manufacture semiconductor devices as quickly and efficiently as possible and it is equally important to utilize resources in the production area most efficiently in order to meet business needs and customer deadlines. To gain competitive advantage, a semiconductor manufacturing fabrication plant is continuously looking for opportunities to shorten cycle time, reduce costs, decrease variability, increase productivity, and to ensure on-time delivery of customer orders. As such, it is undesirable for production lots, i.e. groups of substrates processed together as a group, to sit around idle while awaiting processing. It is also important to utilize the various production and metrology tools so that they are being used efficiently and to their maximum capacity. When a production tool is idle, or when a lot of substrates sits idle, cycle time is increased, costs increase, and productivity decreases. The manufacturing facility runs inefficiently and it is therefore more difficult or even impossible to ensure on-time delivery of customer orders.

It is also important to meet customer deadlines, maintain line balance and avoid inventory accumulation. More particularly, it is undesirable to have inventory accumulating at a particular location or manufacturing tool, while other manufacturing tools sit idle. It is also important for production personnel to process the work pieces, i.e. "lots," in the order that most efficiently achieves the above-identified objectives. As a corollary, it is important for production personnel to quickly and correctly identify which production lots to process, to achieve these objectives.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 3 shows a sample algorithm and priority score displayed on an embodiment of a display screen according to various embodiments of the disclosure;

FIG. 4 shows a sample algorithm and priority score displayed on an embodiment of a display screen according to another embodiment of the disclosure.

DETAILED DESCRIPTION

Figure 1:
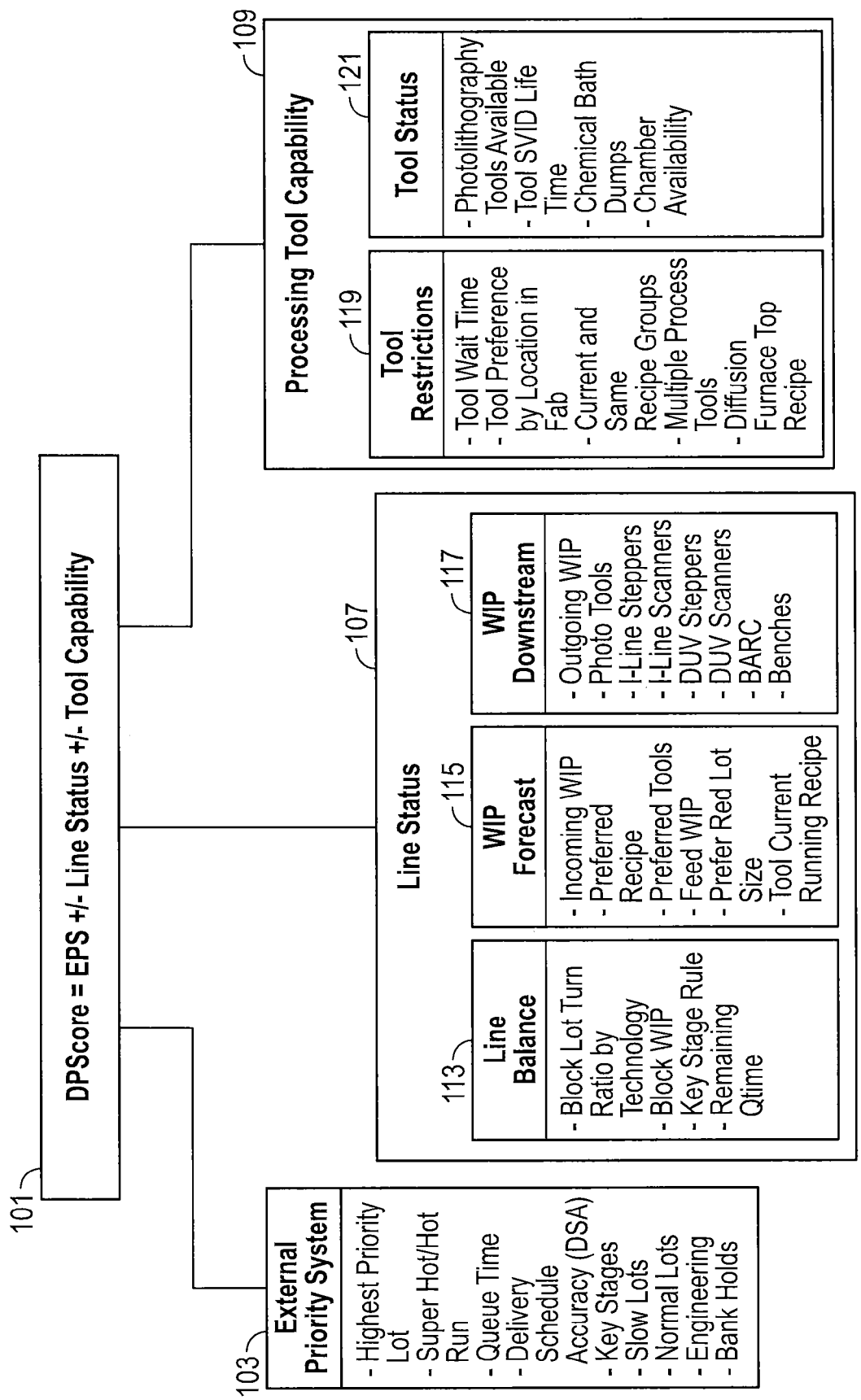
FIG. 1 is a schematic diagram showing various aspects of an algorithm according to various embodiments of the disclosure.

Provided is a system for managing inventory in a production environment, such as a semiconductor device manufacturing fabrication area, often referred to as a "fab". In semiconductor manufacturing, integrated circuits and other semiconductor devices are formed on substrates such as silicon substrates or other suitable semiconductor or other substrates, which are alternatively referred to as "wafers." The substrates are commonly grouped into "lots." The term "lot" is commonly known to be a group of substrates that undergoes processing together through the fabrication facility. Each lot therefore includes a number of substrates processed together as a group.

Semiconductor devices are manufactured by sequentially processing the lot of substrates through a multitude of processing operations and also a multitude of test operations and metrology operations. By "processing" a lot, an operation is performed upon each of the substrates in the lot and depending on the equipment or tool used to carry out the processing operation, the entire lot may be processed simultaneously ("batch" processing) or the substrates may be processed individually. Regardless of whether the substrates undergo processing individually or as part of the group, when the lot of substrates completes one processing operation, the entire lot moves to the next location and is queued for processing at the next operation.

When a lot is moved to the next location, it may be electronically moved to the next processing operation in the inventory tracking system and physically moved to the next station which may be a particular processing tool. Various inventory tracking systems are used in the semiconductor manufacturing industry. Each time a lot reaches a location, i.e. a particular processing operation, there are typically multiple other lots at the same processing operation and there are typically multiple other lots at the tool used to carry out the processing operation.

For example, there may be several lots queued to undergo a particular ("XYZ") film deposition operation and this XYZ film deposition operation may be carried out in more than one processing tool. Conversely, there may be many lots delivered to processing tool ABC, which may be used for various different deposition operations. For example, processing tool ABC may be used for the XYZ film deposition operation and also the deposition of various other types of films.

The processing operations include various photolithography operations, diffusion operations, implantation operations, etching operations, cleaning operations, polishing operations, deposition and sputtering operations, various thermal operations, and various other operations used in combination to produce a finished semiconductor device. When a lot arrives at a tool for processing, the other lots that are also queued at the same tool for processing, may be queued for the same processing operation or a different processing operation. As another example, if a lot is queued for a particular etching operation, the particular etching operation may be carried out in various different tools and one or more of the manufacturing tools, i.e. the etcher, may be used to carry out various other etching operations. For example, if a lot is ready to undergo a polysilicon etching operation, there are likely multiple other lots that are ready to undergo the same polysilicon etching operation. Similarly, if the lot that is ready for the polysilicon etching operation is delivered to a particular etching tool for processing, this particular etching tool often has multiple other lots waiting to be processed.

The disclosed system and method provide a dispatch priority system that prioritizes lots based on many relevant factors such as external priority, line status, and tool capacity. A priority score is established and may be determined using an algorithm including at least a designated external lot priority, various factors related to inventory in the manufacturing facility and various factors related to processing tool capability in the manufacturing facility, each of which may take into account many factors. The preceding are examples and not limiting of the algorithms according to the disclosure. The priority score determines which lot to run. The generated priority score can be tool-specific or module-specific. The production personnel can read a display of all lots at a particular processing operation or at a specific tool, view the calculated priority score for each, and decide which lot has the highest priority, i.e., which lot should be processed first. The disclosed system and method shortens cycle time, reduces costs, decreases variability, increases productivity, balances the production line, and ensures on-time delivery of customer orders.

In some embodiments, the system calculates priority based on a number of factors using an algorithm that takes into account various internal and external factors including those outlined above. The algorithm may be executed manually or by various processors and computer systems, such as a computer or processor associated with the inventory tracking system used in the production facility. Various processors and computers can be used. The factors may be associated with various modules in some embodiments. In some embodiments, the system includes six main modules: 1. External Priority System (EPS); 2. Line Balance; 3. WIP (work-in-progress) Forecast; 4. WIP Downstream factors; 5. Tool Restrictions; and 6. Tool Status. Each of the aforementioned modules includes various aspects that are numerically factored into account in the algorithm, and are explained in greater detail below. In some embodiments, the algorithm is simplified to produce a priority score based on the three factors listed previously: 1) designated external lot priority, 2) inventory in the manufacturing facility (also referred to as line status) and 3) processing tool capability, each of which may take into account many factors. In some embodiments, the inventory in the manufacturing facility (line status) factor includes line Balance, Work In Progress (WIP) forecast, and WIP downstream considerations. Downstream considerations are known in the art to signify considerations based on subsequent scheduled processing operations. In some embodiments, the processing tool capability factor includes tool status and tool restrictions, as will be described below.

In some embodiments, a numerical score is assigned to each lot in the fabrication area as it arrives at each processing operation. Further, the numerical score is assigned to each lot that is queued for processing at a particular processing tool. The numerical score is generated by an algorithm, as referred to above and as will be described in greater detail below. The generated numerical priority score can be tool-specific or module-specific.

In some embodiments, the numerical score used to determine processing priority is a three digit numerical score called the Dispatch Priority Score (DPScore, DPS score or DPS). The DPS is based on a number of factors as described above and further below, and is calculated every time a lot completes a processing operation and is therefore ready, i.e. "queued" for the next processing operation. The DPS is also generated for each lot that arrives at a particular processing operation. The DPS is also generated for each lot that arrives at a particular tool. In some embodiments, the DPS is recalculated dynamically, i.e constantly and automatically. In some embodiments, the DPS is calculated automatically each time a new lot arrives at a processing station, without any prompting or intervention by any personnel. In various embodiments, the DPS is recalculated regularly or periodically. In an embodiment, the DPS is automatically recalculated every 8 minutes, and in other embodiments, the DPS is recalculated every 5 or 10 minutes and in other embodiments, the DPS is recalculated at other pre-determined frequencies and periodicities. According to various embodiments, production personnel can prompt the system to recalculate DPS for all lots at a particular processing operation or all lots that are present at a particular fabrication processing tool. Various processors, computers and other tools can be used as the system. The disclosure also includes a non-transitory, tangible computer readable storage medium encoded with computer program instructions such that, when the computer program instructions are executed by a processor, the disclosed method including calculations performed using the various algorithms, are carried out by the processor and the results automatically organized and displayed.

The DPS is derived using various algorithms in various embodiments and generally takes into account the external priority score (EPS), line status and tool capability.

The EPS, External Priority Score is a priority ranking based on external considerations. According to some embodiments, the EPS is a value based upon customer demands, customer deadlines, business needs, commitment dates and other business requirements external to the fabrication facility. According to various embodiments of the disclosure, the numerical EPS value is adjusted using various algorithms based on internal fabrication area matters such as line status and tool capability, to produce the DPS. In an embodiment, the DPS is a qualitative numerical index based on the following:

DPScore=EPS+/−Line Status+/−Tool Capability.

The EPS is an external requirement of the lot. Alternatively stated, the EPS is not dependent on work in progress (WIP), line balance, inventory, tool status, tool restrictions or other considerations internal to the fabrication area. External requirements include external commitments to customers or others, such as regarding delivery dates or other status commitments based on customer requests. For example, based on when the lot is promised for completion and when it is started, the lot may be characterized as a highest priority lot, a super-hot lot, a hot lot, a normal lot, an engineering lot or a slow lot but various other designations may be used. Various numerical values may be assigned to lots of each of the aforementioned EPS categories. In some embodiments, the EPS is expressed as a 3 digit numeric code. In some embodiments, the lower the 3 digit number, the higher the priority of the lot, i.e. the lot should be processed sooner than lots of lower priority. According to some embodiments, the EPS is expressed as follows:

001-009: Highest Priority
100-199: Queue Time constrained
200-299: Super-Hot
300-399: Hot Run
400-899: Normal The preceding chart is an example according to an embodiment and various other designations and associated values are used to assign an EPS to a lot, in other embodiments. The DPS is then calculated using the numerical value of the EPS and various factors internal to the production area, using various algorithms.

Now referring to FIG. 1, algorithm 101 is an algorithm according to various embodiments of the disclosure, but various other algorithms are used to calculate DPS according to other aspects and embodiments of the disclosure. One factor used in the algorithm is the EPS (External Priority Score) 103 which is as discussed above. The DPS is produced using algorithm 101 by taking the EPS 103 and adding or subtracting factors associated with line status 107 and (processing) tool capability 109. The various factors associated with line status 107 and processing tool capability 109 may be converted to numerical values using various equations and algorithms that may assign different weights and values to various aspects of the factors. In other words, all of the following factors are not necessarily weighted the same in producing a numerical value for line status 107 and processing tool capability 109.

Line status is generally defined as line inventory in the manufacturing facility. In some embodiments, line status 107 represents a numerical value generated by an algorithm that takes into account several line status, i.e., inventory, factors. Such inventory factors in the production facility include factors related to, but not limited to, line balance 113, WIP forecast 115, and WIP downstream considerations 117.

Processing tool capability 109 generally refers to processing tool status (availability) and processing tool restrictions, i.e. unavailability, and as described further below. In some embodiments, processing tool capability 109 represents a numerical value generated by an algorithm that takes into account several processing tool capability considerations such as, but not limited to, tool restrictions 119 and tool status 121, each described below.

Regarding line status 107, line balance 113 is the balance of the distribution of lots throughout the production area. Line balance 113 is generally described as the desired WIP at each station and is represented by a numerical value. The numerical values may be determined based upon the desirability to run a lot at a certain location to maintain line balance and depend on several factors such as the listed factors for line balance 113 in FIG. 1. Lots that are more desirable to run to maintain inventory balance may be assigned a lower numerical value, i.e. higher priority, and lots that are less desirable to run to maintain inventory balance may be assigned a higher numerical value, i.e. lower priority. The numerical value will depend on the various factors listed in line balance 113, above. The desired WIP, i.e. line balance 113, is determined based on the throughput of the bottleneck tool speed and technology type, in some embodiments. Keeping the line balanced helps remove bottlenecks and improve the number of moves made in the fabrication area, and cycle time. In some embodiments, line balance is dependent upon turn ratios. When a lot is fabricated, it undergoes a sequence of processing operations from start until its completion. The sequence of processing operations can be divided into stages, or groups of stages called blocks. The speed at which a lot progresses through each block is defined as the turn ratio. In some embodiments the turn ratio is calculated as [stage moves/WIP], i.e. the number of moves through a stage or group of stages (blocks) divided by the WIP at that stage. Still referring to FIG. 1, line balance 113 includes considerations such as the block lot turn ratio by technology, block WIP, key stage rule, and remaining Qtime (described below).

The block lot turn ratio is a turn ratio in a particular block and is defined by and associated with, a certain technology or other defining characteristics such as customer due date and monthly turn ratio goals. The block turn ratio may be described as a priority order for lots progressing through the fab and may be based upon a "normal" lot in some embodiments. Various levels of control limits are designed for each block turn ratio by technology. If processing in the fabrication area indicates that the block turn ratio is not within control limits (i.e. the lot is moving too slowly), the rule can be applied to provide a lower numerical value in the algorithm to adjust the lot priority score to a lower value (higher priority) to move the lot more quickly and restore the lot's turn ratio to control levels. The block lot turn ratio rule compares a turn ratio of the lot required for the lot to attain its due date in each block. If the required block lot turn ratio is greater than the target block lot turn ratio, then a lower value is assigned so that the priority of the lot is increased enabling the lot to be processed faster to achieve the required turn ratio.

Block WIP of line balance 113 detects WIP levels at each block. If the block in which the lot is currently situated, has a low WIP volume, then any lots in the previous block would get an assigned numerical value associated with a higher priority value so that they are processed and moved to the block with the low volume, in order to maintain line balance. The key stage rule in line balance 113 is related to key stages in the processing operation that are selected and designed to improve line linearity. This rule is designed to assign numerical values to the lots designed to help keep a balanced WIP level at key stages identified by production needs so that weekly demands of WIP levels at various stages can be met. The remaining Qtime factor is described in conjunction with example 2, below.

WIP forecast 115 is a line status factor that includes various factors regarding the volume of the WIP in the production facility. In some embodiments, WIP forecast 115 includes rules designed to consider incoming WIP to multiple tools based on various recipe groupings. For example, incoming WIP to a particular tool group can be distributed among a number of different tools in various embodiments. The WIP forecast is represented numerically for each lot and each tool. This distribution may be determined based on the availability of various recipes that can run on the various tools. Many tools running a particular recipe can be switched to run another recipe to support WIP demand.

In some embodiments, the WIP forecast 115 takes into account at least the following factors listed in FIG. 1: incoming WIP, various preferred recipes, preferred tools, feed WIP, preferred lot size and the recipe currently running in a tool. A numerical value is associated with the WIP forecast 115. By taking feed WIP into account, the WIP forecast rule searches for lots that have not yet reached the processing stage in question and considers lots that are multiple stages prior to the processing stage in question, to maximize tool efficiency. When a lot reaches a particular processing stage, it has been assigned a numerical value associated with the desirability to run the lot at that tool at that time based on when the lot arrived at the tool, other WIP and also the speed at which the lot may be processed through the tool. Numerical values are assigned consistent with the desirability to run a particular lot to maximize tool efficiency and avoid idle time. Various algorithms calculate and determine priority of lots based on factors listed above. Various other WIP forecast considerations are used in other embodiments. The "tool current running recipe" factor can be described as a factor that numerically prioritizes lots that run using the same recipe as the recipe that is currently running on tool.

The preferred tools factor in WIP forecast 115 is a factor taken into account and which assigns a numerical value that is indicative of a preferred recipe group to be run on a tool based on process restrictions, qualifications and/or processing time. A group table contains details of preferred tools to run certain recipes and the preferred tools factor assigns numerical values to a lot that preferentially associated the lot with a tool based on the process recipe required by the lot.

A dispatching system detects which recipe is running on tools and numerically prioritizes lots of that recipe.

The WIP downstream considerations 117 of line status 107 include various factors such as listed in FIG. 1. Various rules are generated based on these various factors and the rules are used to produce numerical values using various algorithms. Downstream considerations can generally include an assessment of outgoing WIP balance needed to help evenly feed the line. The rules are based on but not limited to being based upon outgoing WIP considerations, and the current distribution of that WIP at various tools of the same processing capability. In some embodiments, re-balancing WIP is performed at photolithography equipment (e.g., I-Line steppers, I-Line scanners, DUV steppers, DUV scanners and BARC coaters) and wet benches because the lots are processed by these tools and return to these tools, multiple times. As such, the photolithography area is particularly taken into account in the downstream considerations 117.

Various algorithms may be used to combine line balance 113, WIP forecast 115 and downstream considerations 117 to provide a numerical value for line status 107. Various factors may be weighted differently. According to the embodiment in which [DPS=EPS+/−Line Status+/−Tool Capability], the numerical value for line status 107 may be added to or subtracted from the EPS in obtaining the DPS. In other embodiments, either or all of EPS, Line Status and Tool Capability may be weighted by multiplication by a weighting factor.

Processing tool capability 109 (i.e. tool capability as in algorithm 101) includes factors and considerations associated with tool restrictions 119 and tool status 121. The DPS is dependent upon tool capability 109. Various rules and algorithms are associated with tool restrictions 119 and tool status 121. The rules and algorithms take into consideration, in various embodiments, tool wait time, tool preference by geographical location in the fabrication area, recipes currently being run on the processing tools, recipes that are from the same recipe group, the availability of multiple process tools for carrying out a processing operation, preferred processing tools for a particular processing operation, scheduled preventive maintenance schedules, and status of the scheduled preventive maintenance and diffusion furnace top recipe rule which is a rule that helps distinguish highest priority lots in a group of multiple recipes. A numerical priority value is assessed based on many of the various factors which may be weighted differently and which may be produced using various algorithms. In some embodiments of the "tool preference by (geographical) location in the fabrication area" rule of tool restrictions 119, the inventory monitoring system searches through available WIP list and selects one highest priority lot from each available recipe up to a limit associated with the tool. In other words, if the WIP at a tool at a particular time includes a total of 10 lots and 3 of the 10 lots are to be run on one recipe, a highest priority lot of the 3 is identified and assigned a numerical value associated with a higher priority than the other 2 lots using the same recipe. The tool limit is a threshold defined by user that allows a prescribed number of high priority lots to be selected by the system.

These factors are taken into account for tool restrictions 119 which is generally described as any restriction that would prevent an otherwise available tool from being used to process the lot queued for processing. The numerical value for tool restrictions 119 may be assigned or generated using various algorithms that take into account various factors listed in FIG. 1 and discussed above, and which may be weighted differently in various embodiments.

Tool status 121 represents the tool status, e.g. available, unavailable because it is being used, unavailable because it is scheduled for maintenance, unavailable because it is deficient of a component or consumable, e.g. chemical, gas, etc., and the like. A numerical value is associated with tool status 121 and may be assigned or generated using an algorithm that takes into account factors such as listed in FIG. 1 and including the availability of photolithography tools, the scheduling of chemical bath dumps, availability of various chambers and various process tools and tool SVID (System Variable ID) lifetime which is a tool parameter that indicates tool status based on the following. The manufacturer of a particular manufacturing tool may suggest a PM (Preventative or Planned Maintenance) procedure when chemical counts in bath reach a certain level, or when a certain number of hours have been run on a tool, for example. When such a suggested PM is due, the tool status is impacted by the SVID factor. Tool status 121 is a dispatching rule that identifies which WIP to run based on this SVID value and the other factors listed above and in FIG. 1. Together, these factors yield a numerical value that may be used in algorithm 101. According to the embodiment in which [DPScore=EPS+/−Line Status+/−Tool Capability], an algorithm is used to generate a numerical value for processing tool capability 109 that is added to or subtracted from the EPS in obtaining the DPScore.

The rules in each of the 6 modules External Priority Score 103, WIP Forecast 115, Line Balance 113, WIP Downstream 117, Tool Restrictions 119 (i.e., tool availability) and Tool Status 121 are assigned points using various algorithms as described above and produce a DPS.

In some embodiments, a global DPS is obtained by assigning and calculating numerical values and using the algorithm, as described above. In addition to the global DPS, the disclosure provides for modifying the global DPS by module or area (i.e. a section of the production area such as the etch area, the diffusion area, and the like) using a separate calculation as will be seen in the examples, below. In this manner, an interim or global DPS score is achieved and then an adjusted or final DPS score is generated, which may be the same or different than the interim or global DPS. The adjusted or final DPS score is based on module, geographical location or specific tool. In this manner, the generated DPS priority score can be tool-specific, geographic area in fab-specific, or module-specific. This "module factor" adjustment allows for determining which rules are more significant than others in different modules or areas and therefore takes into account changing fabrication operating conditions in various modules, for different geographical locations or at different tools.

Figure 2:
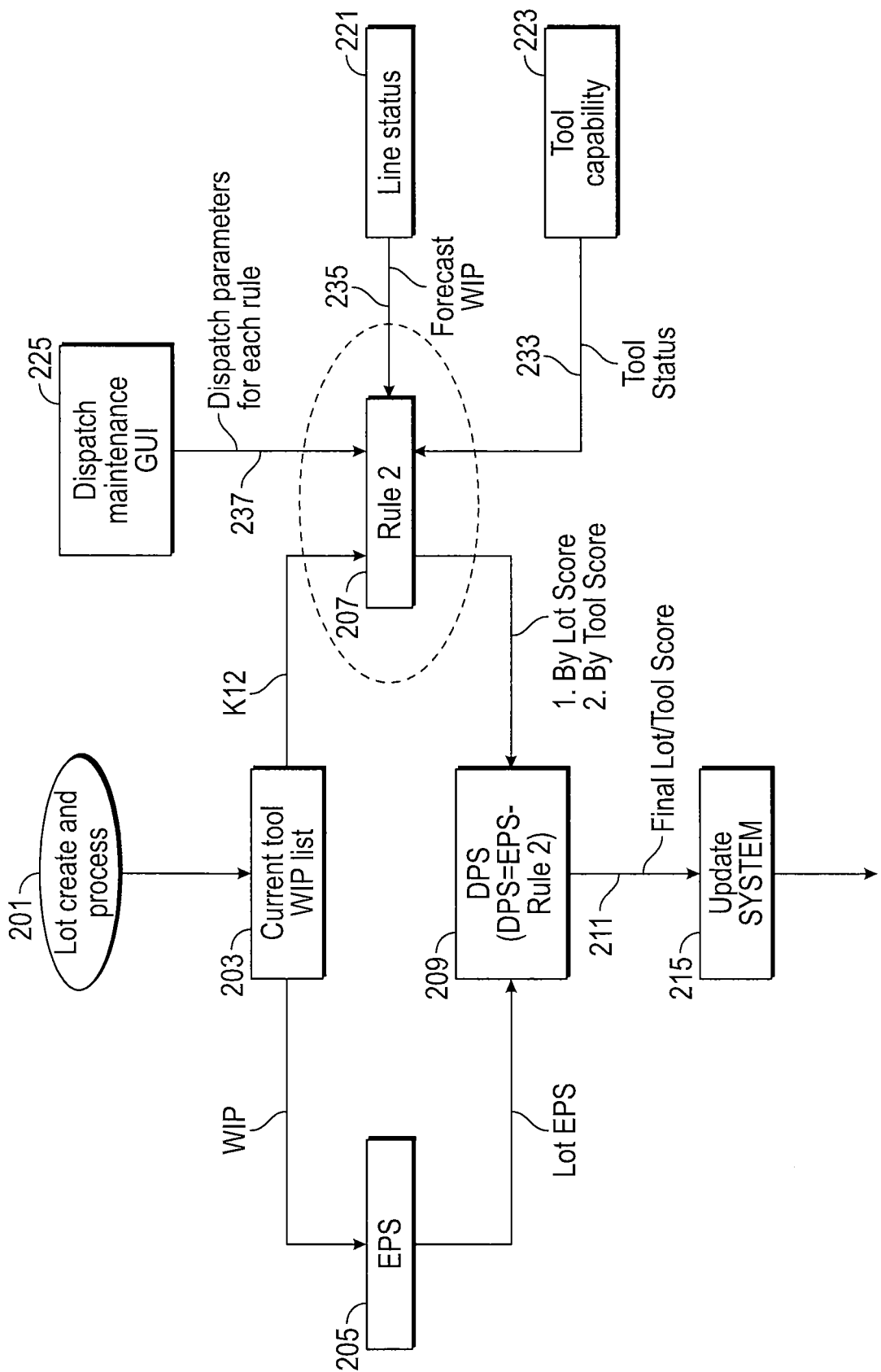
FIG. 2 is a schematic diagram, including a flowchart that illustrates a method according to various embodiment of the disclosure.

FIG. 2 is a schematic including a flowchart according to an embodiment of the disclosure. At lot create and process step 201, a number of lots are created, each lot including a plurality of substrates processed together as a group and at step 201 a lot has completed initial preparation or a previous processing operation and is ready to be processed at a subsequent processing operation. At step 203, the lot is delivered to a processing operation and/or a tool and is queued for the next processing operation. The tool may be any of various processing tools, a metrology tool, a test tool, or any other tools, machines or apparatuses used in the fabrication, measuring and testing of semiconductor devices. The tool includes a WIP list showing all of the lots that have arrived at this tool and which await processing in the tool. A WIP list showing all lots queued for a particular processing operation is also generated. The WIP lists may be displayed on various graphical user interlaces (GUI's) and screens using various formats. After the lot is delivered to a processing operation and/or a tool and is queued for the next processing operation (step 203) but before processing has begun at a particular processing operation, the DPS for that particular processing operation is generated at step 209. The DPS, as described above, includes the EPS provided at step 205 and also "Rule 2" provided at step 207 (see below) according to the equation "DPS=EPS−Rule 2." As above, the EPS (External Priority Score) provided at step 205 is a priority ranking based on external considerations regarding the lot queued for processing at step 203. Other equations are used in other embodiments. At step 209, the DPS is calculated using any of various algorithms that take into account the EPS score and various fabrication factors take into account in Rule 2 (step 207).

At "Rule 2," step 207, various factors combine to produce a rule that is assigned a numerical value. The factors that combine to determine Rule 2 depend on the details of the lot queued for processing at step 203 as well as both line status 221 and tool capability 223, similar to line status 107 and processing tool capability 109 described above and shown in FIG. 1. Line status 221 and tool capability 223 are determined based on the processing location and stage of the lot queued for processing at step 203. In some embodiments, "Rule 2" is [+/−Line Status+/−Tool Capability] with the factors weighted variously, as described above. Dispatch maintenance GUI 225 provides rules and weighting associated with each of the factors in line status 221 and tool capability 223. The DPS is calculated at step 209 according to the equation [EPS]−[Rule 2] in this embodiment. At 211, the DPS score is provided to the system at update system step 215. At update system step 215, the system, i.e. the inventory tracking system of the fabrication area and the production management system of the fabrication area, includes updated DPS scores for each lot that arrives at a tool for processing and for each tool in which a lot, ready for processing, can be processed. Processing continues after update system step 215.

In some embodiments, a list of all lots at a particular processing operation is displayed with their associated DPS scores. The display may be on a GUI. In some embodiments, a display of all lots delivered to a particular processing tool and their associated DPS scores and therefore processing orders, are displayed. The display may show the scores and processing orders for each lot at each processing operation. The processing operator or technician can then refer to the DPS scores and process the lot with the highest priority; e.g. the lot with the lowest number DPS score according to the embodiment in which the lowest DPS score means the lot with the highest priority for processing based on the DPS calculated at step 209 and provided at update system step 215. This is repeated for each processing, testing and metrology operation at which a new lot arrived. This is also repeated each time a lot is completed at an operation and is queued for the following operation, until the processing of the lot is complete and the semiconductor devices are completed.

EXAMPLES

The following examples are provided to illustrate a calculation of interim or global DPS scores and adjusted or final DPS scores, according to various embodiments of the disclosure and are not intended to be limiting of the disclosure. Further, the display and the appearance of the display in each of FIGS. 3 and 4 are presented by way of example and in each case, different display formats may be used and the data for multiple lots displayed simultaneously.

FIG. 3 shows Example 1 which is a display 301 of lot status according to an embodiment of the disclosure, but it should be understood that the display represents just one of various ways that the lot status and DPS score can be displayed on a GUI or in another manner, in the fabrication area. Further, these examples are just an example calculation, and it should be understood that Examples 1 and 2 each represent just one calculation using an algorithm according to an embodiment and that other algorithms and other calculations area are used in other embodiments. Each of the examples provides one or more DPS scores and, according to these examples, a lower DPS score indicates that a lot is a higher priority for processing.

Example 1

In Example 1 illustrated in FIG. 3, a DPS of 516 is achieved for an example lot according to the following equation:

$$DPS=816 \text{ (EPS)}-300 \text{ (Total Points from Dispatching Rules)}=516$$

As will be seen the DPS score of 516 is an interim or global DPS score identified as interim DPS 303 in FIG. 3. The EPS score 307 is as described above and the 816 value for EPS score 307 may be determined using various considerations regarding external requirement of the lot as described above. The 300 points from rules ("Total Points from Dispatching Rules" 313) represents the points from algorithms related to line status, i.e. inventory, and processing tool capability, and may be "Rule 2" as in FIG. 2, and is derived according to the following.

The line status value (see line status 107, FIG. 2) i.e. inventory factors, is applied to the example lot based on the line balance 113 factor of Block Lot TR (Turn Ratio). The example lot is in block 4 and of a technology type arbitrarily designated technology type "d." Technology type "d" can signify any of various technology types in various embodiments and is an arbitrary designation. Lot A is running slower than its turn ratio requirement in block 4 for technology "d." The example lot A needs 3.55 turns in block 4 to meet its due date for completing block 4. The block 4 turn ratio target for technology type "d" is 3.50 according to the example.

Level 1: 3.30→100 points
Level 2: 3.40→200 points
Level 3: 3.50→300 points

The point value is indicative of how far behind a lot is, with respect to its lot turn ratio goal. Level 3 indicates that the lot is furthest behind; and level 1 indicates that the lot is least behind in processing according to this exemplary scale. Since the example lot requires 3.55 turns to achieve its block turn ratio, it falls under level 3 and is assigned 300 points, since the example lot is significantly behind. The greater value of 300 produces a lower DPS than a value of 100, meaning that the lot processing priority will be higher due to a lower DPS score. The assigned value of 300 points (level 3, 3.50 turns) is used as part of the line status numerical value in the algorithm and appears as "Total Points From Dispatching Rules" 313 as shown in FIG. 3. In this algorithm according to an embodiment, the 300 points is the only value used for the "Total Points From Dispatching Rules" 313 as shown in FIG. 3.

The lot in Example 1 receives an interim or global DPS score 303 having a value of 516 according to the algorithm using [EPS=816]−[Total Points from Dispatching Rules=300]=DPS. According to some embodiments, the interim or global DPS score 305 with a value of 516 is used to determine lot processing priority.

In some embodiments, other factors such as tool, module or geographical area specific factors are also taken into account to produce an adjusted or final DPS, which may be module-specific, tool-specific or geographical area-specific. The calculation of the Tool-Specific DPS score 311 is also shown in FIG. 3. In other embodiments, the adjusted DPS score 309 is module-specific or geographical area-specific.

In one example, the geographical location of the tool in the fabrication area is taken into account to produce adjusted or final DPS that may be module-specific, area-specific or tool specific. Still referring to FIG. 3, an additional factor "Score From Tool Rules" 305 is a tool preference rule takes into account the geographical location of the processing tool in the fabrication area. The rule assigns numerical values to distribute WIP to preferred tools by recipe and/or stage with respect to location of tool in the fab and current WIP levels, in some embodiments. Points are assigned to help increase priority at specified preferred tools. For example Lot A has a "Score From Tool Rules" 305 score of 200 on Tool X but a "Score From Tool Rules" score of 100 on Tool W in FIG. 3. Lot A has an EPS (External Priority Score) 307 value of 816 and an interim DPS score 303 having a value of 516. Accordingly, Lot A has a final adjusted DPS 309 having a value of 316 on tool X and a final adjusted DPS 309 value of 416 on tool W.

The final adjusted DPS score 309 having values of 316 and 416 is calculated using the interim or global DPS score 303 having a value of 516 as calculated above and adjusting the interim or global DPS score 303 based upon factors such as tool, module or geographical area specific factors as above. The final adjusted DPS score 309 is the score for the example lot that is displayed on the inventory management system for production personnel to see and compare to other DPS values for other lots queued for processing at a particular operation or at a particular processing tool.

An advantage of the disclosure is that the adjusted, final DPS score 309 is determined by module or tool specific factors in various embodiments. The adjusted, final DPS determines the priority for running the lot.

Example 2

In Example 2 illustrated in FIG. 4, sample Lot A includes an interim or global DPS score 303 having a value of 580 and also includes an adjusted or final, module-specific DPSscore 309 having a value of of 280 for each of tools X, Y, Z and W as shown in display 401 of FIG. 4.

Lot A has an EPS (External Priority Score) 307 value of 830 in Example 2. Lot A has a "Total Points from Dispatching Rules" 313 score of 250 in Example 2. The interim or global DPS score 303 having a value of 580 is achieved for sample Lot A according to the following equation:

DPS=830 (EPS)−250 (Total Points from Dispatching Rules)=580

The interim or global DPS score 303 having a value of 580 is achieved according to the above equation which includes 250 total points from rules using various factors as described below. In some embodiments, the various factors are +/−Line Status+/−Tool Capability as described above.

After the interim or global DPS score 303 having a value of 580 is achieved according to the above equation, the tool prefer by location in fab factor (see tool restrictions 119) assigns 300 additional points to the 4 tools X, Y, Z and W. This value appears as "Score From Tool Rules" 305 in FIG. 4. As indicated in FIG. 4, tools X, Y, Z and W are part of a group of 10 tools. In some embodiments, the 300 additional points are only assigned to tools X, Y, Z and W and not the other 6 tools of the group. According to this embodiment, lot A has an adjusted or final DPS score 309 value of 280 on tools X, Y, Z and W whereas lot A has an adjusted or final DPS of 580 equal to the interim or global DPS score of 580 on the other tools of the group.

In Example 2, the 250 total points from dispatching rules, i.e, "Total Points from Dispatching Rules" 313, is determined as follows. The processing tool restriction has a value of 50.9 and is related to tool wait time (see tool restrictions 119, above). The tool wait time may be (1−(Tool Target Wait Time/Lot Wait Time)) in one algorithm according to the disclosure and as shown in FIG. 4. At the processing operation of interest, the wait time tool target is =3.50 hours and example lot A wait time was=5.3 hours in three example. The algorithm calculates the processing tool restriction as follows: tool wait time=(1−(3.5/5.3))=0.339. In some embodiments, an arbitrary multiplicand of 10 is used as a rule factor to display the product number as x.yy. In this embodiment of example 2, this may be expressed as tool wait time=(1−(3.5/5.3))=x 10 (rule factor)=3.39. The algorithm may be adjusted by the user to assign a rule factor to increase or decrease the dispatching power on the specific rule in various embodiments. The tool wait time is assigned a weight factor of 10 at the indicated processing operation, yielding 3.39 points. A weight factor of 15 is assigned to tool restriction factors 119, thus providing 3.39×15 (weight) =50.9 total points according to one algorithm.

A line balance value of 200 is shown in FIG. 4 and is based on factors detailed in line balance 113, above. The two values of processing tool restriction of 50.9 (rounded to 50) and line balance of 200 are indices of tool capability and are combined to produce the 250 total points from dispatching rules as in the equation above and as shown in FIG. 4 as "Total Points from Dispatching Rules" 313.

In some embodiments such as in Example 2, the line balance (113) numerical value of 200 is "X-ratio Qtime" which is based on remaining Qtime and is produced by taking into account downstream process times as compared to remaining Qtime. The maximum allowed time between a particular group of steps as established for quality control guidelines is called the queue time or "Qtime." In Example 2, the line balance value of 200 takes into account the processing time of remaining steps as compared to Qtime up to a particular point, referred to as the reset point. In Example 2, the line balance value is calculated using the formula [Remaining Qtime/Theoretical remaining CT]=X-Ratio Qtime. In this formula, the Theoretical remaining CT is the typical wait and processing times for all operations up to the reset point and the Qtime is as described above. A lower X-ratio means higher priority.

According to one algorithm such as used in Example 2, if the X-Ratio Qtime is less than 15, 200 points are assigned; if the X-Ratio Qtime is less than 10, 300 points are assigned and if the X-Ratio Qtime is less than 5, 400 points are assigned. Lot A in Example 2 of FIG. 4 has an X-ratio of less than 15 therefore is assigned 200 points for line balance.

In summary, the EPS 307 in Example 2 for Lot A was 830 and the Total Points from Rules 313 was 250 to produce an interim or global DPS score 303 having a value of 580 according to the above equation. Lot A has an adjusted or final DPS 309 having a value of 280 on tools X, Y, Z and W and an adjusted or final DPS of 580 equal to the interim or global DPS score of 580, on the other tools of the group. The adjusted or final DPS value is used to determine lot processing priority.

It should be understood that, in other embodiments, other algorithms are used. The numerical values presented herein, are arbitrary. In other embodiments, lots with the highest DPS score will have a higher priority and will be processed first.

The disclosure also provides for displaying, at each processing operation, all of the lots queued for processing at that operation and displaying the associated DPS numerical values for each of the lots at that processing operation. In some embodiments, the display of FIGS. 3 and 4 may be manipulated to display all of the lots or multiple lots at an operation or other location in the manufacturing facility along with their associated DPS numerical values. The same listing of lots with associated DPS numerical values is available for each processing tool in the production area. According to various embodiments, production personnel can request the immediate dynamic updating of all DPS numerical values. Based on this display, the production personnel can then choose which production lot to run at the processing operation at question. In various embodiments, the lots can be displayed in order of their adjusted or final DPS priority score. In various embodiments, the numerical values for the DPS for all lots at a processing operation are generated and displayed by the inventory tracking system used in the production area. According to some embodiments, the inventory tracking system also includes information on processing tool availability, and in some embodiments, the inventory display indicates which processing lot has the lowest DPS score and should be processed next, and also indicates which particular processing tool to be used for carrying out the processing operation on the identified lots based on inventory availability of the tools. In various embodiments, the lots can be displayed in order of their DPS priority score.

In some embodiments, a method for managing inventory in a semiconductor device production area, is provided. The method includes: creating a plurality of lots in a manufacturing facility, each lot including a plurality of substrates processed together as a group, generating a priority score for each lot at each processing operation of a plurality of processing operations used to fabricate a semiconductor device, using an algorithm that includes at least a designated external lot priority, inventory factors in the manufacturing facility and processing tool capability factors; and at each processing operation, determining a processing order of the lots based on the priority score.

According to other aspects, an inventory management system for a semiconductor device production facility is provided. The inventory management system comprises: a processor for calculating a priority score using an algorithm that takes into account external requirements, inventory factors in the production facility and processing tool capability factors, for each lot of a plurality of lots in a manufacturing facility, each lot including a plurality of substrates processed together as a group; and a display that displays the priority score for each lot at each processing operation of a plurality of processing operations and therefore a processing order of the lots based on said priority score.

In some embodiments, the inventory management system further comprises an inventory tracking system that monitors the location of each of the lots in the manufacturing facility and wherein the display further displays an overall inventory of the lots at each processing operation According to other aspects, provided is a non-transitory, machine readable storage medium, encoded with computer program code, such that when the computer program code is executed by a processor, the processor performs.a method comprising: creating a plurality of lots in a manufacturing facility, each lot including a plurality of substrates processed together as a group, generating a priority score for each lot at each processing operation of a plurality of processing operations used to fabricate a semiconductor device, using an algorithm that includes at least a designated external lot priority, inventory factors in the manufacturing facility and processing tool capability factors; and at each processing operation, determining a processing order of the lots based on the priority score.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A method for manufacturing in a semiconductor device production area, said method comprising:
   creating a plurality of lots in a manufacturing facility, each said lot including a plurality of substrates processed together as a group;
   generating a priority score for at least one processing operation used to fabricate a semiconductor device, using an algorithm that includes at least a designated lot priority, inventory factors in the manufacturing facility and processing tool capability factors, wherein said algorithm comprises calculating said priority score using an equation comprising: said priority score=(said designated external lot priority)+/−(said inventory factors)+/−(said processing tool capability factors);

at said at least one processing operation, determining a processing order of said lots based on said priority score; and processing said lots based on said processing order.

2. The method as in claim 1, wherein said designated lot priority is a numerical value in which higher priority lots based on external requirements, are assigned lower numerical values and said determining a processing order of said lots includes processing lots with lower priority scores before lots with higher priority scores, and wherein said generating is carried out at least one of automatically and dynamically.

3. The method as in claim 1, wherein said inventory factors includes line balance, WIP forecast and considerations based on subsequent scheduled processing operations and said processing tool capability factors include factors related to tool restrictions and tool status.

4. The method as in claim 1, wherein said generating is carried out at least one of automatically and periodically.

5. The method as in claim 1, wherein said generating takes place each time a new lot of said plurality of lots is received at one of said processing operations.

6. The method as in claim 1, further comprising, at each said processing operation, assigning a particular processing tool to be used for carrying out said processing operation on an identified lot of said plurality of lots and wherein said algorithm assigns different weights to various ones of said inventory factors in the manufacturing facility and said processing tool capability factors.

7. The method as in claim 1, further comprising, for each said processing operation and for each said processing tool, displaying a list of said lots in queue for processing therein in order of said priority score.

8. The method as in claim 7, wherein said generating includes generating said priority score associated with a specific processing tool or a specific module in said semiconductor device production area.

9. The method as in claim 1, wherein said generating includes generating said priority score based on a geographical location in said semiconductor device production area such that a particular lot of said plurality of lots has a different generated priority score at a first geographical location than at a second geographical location.

10. The method as in claim 1, wherein said inventory factors comprises at least one of overall volume of WIP (work-in-progress) in said semiconductor device production area, volume of WIP at a particular processing operation in said semiconductor device production area, volume of WIP at a particular processing tool in said semiconductor device production area and availability of processing tools in said semiconductor device production area available for subsequent processing operations of said lot, and wherein said processing tools for said subsequent processing operations comprise steppers, scanners, coaters, wet processing benches, and plasma processing tools.

11. The method as in claim 1, wherein said processing tool capability factors include geographical location of said processing tool in said semiconductor device production area, recipes currently being run on said processing tools, preferred processing tools for particular processing operations, scheduled preventive maintenance schedules, and status of said scheduled preventive maintenance.

12. An inventory management system for a semiconductor device production facility, comprising:

a processor for calculating a priority score using an algorithm that takes into account external requirements, inventory factors in the production facility and processing tool capability factors, for each lot of a plurality of lot in a manufacturing facility, each said lot including a plurality of substrates processed together as a group; and a display that displays said priority score for each said lot at at least one processing operation and therefore a processing order of said lots based on said priority score, wherein said algorithm comprises calculating said priority score using an equation comprising:

said priority score=(said external requirements)+/−(said inventory factors in the production facility)+/−(said processing tool capability factors).

13. The inventory management system as in claim 12, further comprising an inventory tracking system that monitors location of each of said lots in said manufacturing facility and wherein said display further displays an overall inventory of said lots at each said processing operation, and wherein said processor is capable of using said algorithm to generate said priority score based on a geographical location in said semiconductor device production facility such that a particular lot of said plurality of lots has a different generated priority score at a first geographical location than at a second geographical location.

14. The inventory management system as in claim 12, wherein said algorithm enables said processor to calculate said priority score associated with at least one of a specific processing tool and a specific module in said semiconductor device production facility.

15. The inventory management system as in claim 12, said inventory factors include line balance, WIP (work in progress) forecast, and subsequent processing considerations and said processing tool capability factors includes factors related to tool restrictions and tool status.

16. The inventory management system as in claim 12, wherein said inventory factors comprises at least one of overall volume of WIP (work-in-progress) in said semiconductor device production area, volume of WIP at a particular processing operation in said semiconductor device production area, volume of WIP at a particular processing tool in said semiconductor device production area and availability of processing tools in said semiconductor device production area available for subsequent scheduled processing operations of said lot; and said processing tool capability factors include geographical location of said processing tool in said semiconductor device production area, recipes currently being run on said processing tools, preferred processing tools for particular processing operations, scheduled preventive maintenance schedules, and status of said scheduled preventive maintenance.

17. A non-transitory, machine readable storage medium, encoded with computer program code, such that when the computer program code is executed by a processor, the processor performs a method comprising:

creating a plurality of lots in a manufacturing facility, each said lot including a plurality of substrates processed together as a group;

generating a priority score for at least one processing operation used to fabricate a semiconductor device, using an algorithm that includes at least a designated external lot priority, inventory factors in the manufacturing facility and processing tool capability factors, wherein said algorithm comprises calculating said priority score using an equation comprising: said priority score=(said designated external lot priority)+/−(said inventory factors)+/−(said processing tool capability factors); and at said at least one processing operation, determining a processing order of said lots based on said priority score.

18. The non-transitory, machine readable storage medium of claim 17, wherein the step of generating a priority score includes said inventory factors including line balance, WIP forecast and considerations for scheduled subsequent processing operations, and said processing tool capability factors including factors related to tool restrictions and tool status, and wherein said generating includes generating said priority score based on a geographical location in said semiconductor device production area such that a particular lot of said plurality of lots has a different generated priority score at a first geographical location than at a second geographical location.

19. The non-transitory, machine readable storage medium of claim 17, wherein the step of generating is carried out at least one of automatically and dynamically.

\* \* \* \* \*